United States Patent
Loehnert et al.

(10) Patent No.: US 11,804,385 B2
(45) Date of Patent: Oct. 31, 2023

(54) METHOD, CONTROL DEVICE AND VACUUM ARRANGEMENT

(71) Applicant: VON ARDENNE Asset GmbH & Co. KG, Dresden (DE)

(72) Inventors: Mirko Loehnert, Dresden (DE); Christin Kretzschmar, Dresden (DE); Christoph Haeusler, Freital (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 342 days.

(21) Appl. No.: 17/118,645

(22) Filed: Dec. 11, 2020

(65) Prior Publication Data
US 2021/0183664 A1 Jun. 17, 2021

(30) Foreign Application Priority Data
Dec. 16, 2019 (DE) .................. 10 2019 134 546.4

(51) Int. Cl.
*H01L 21/67* (2006.01)
*H01L 21/677* (2006.01)

(52) U.S. Cl.
CPC .. *H01L 21/67017* (2013.01); *H01L 21/67748* (2013.01)

(58) Field of Classification Search
CPC ................ H01L 21/67017; H01L 21/67748
See application file for complete search history.

(56) References Cited

U.S. PATENT DOCUMENTS

| | | | |
|---|---|---|---|
| 4,313,815 A | 2/1982 | Graves, Jr. et al. | |
| 5,837,059 A | 11/1998 | Glants | |
| 2006/0188658 A1 | 8/2006 | Grant | |
| 2010/0068009 A1* | 3/2010 | Kimura | H01L 21/67745 414/217.1 |

FOREIGN PATENT DOCUMENTS

DE 102014008170 A1 12/2015
EP 1712822 A1 10/2006

OTHER PUBLICATIONS

German Search Report based on application No. 10 2019 134 546.4 (7 pages) dated Jul. 24, 2020 (Reference Purpose Only).

* cited by examiner

*Primary Examiner* — Saul Rodriguez
*Assistant Examiner* — Willie W Berry, Jr.
(74) *Attorney, Agent, or Firm* — VIERING,JENTSCHURA&PARTNER mbB

(57) ABSTRACT

According to various aspects of the disclosure, a method may comprise: varying a drive force, by which a chamber valve of a vacuum chamber is held closed, when the vacuum chamber has been evacuated; and aerating the vacuum chamber after the variation of the drive force; transporting a substrate through the chamber valve when the chamber valve has been opened.

18 Claims, 4 Drawing Sheets

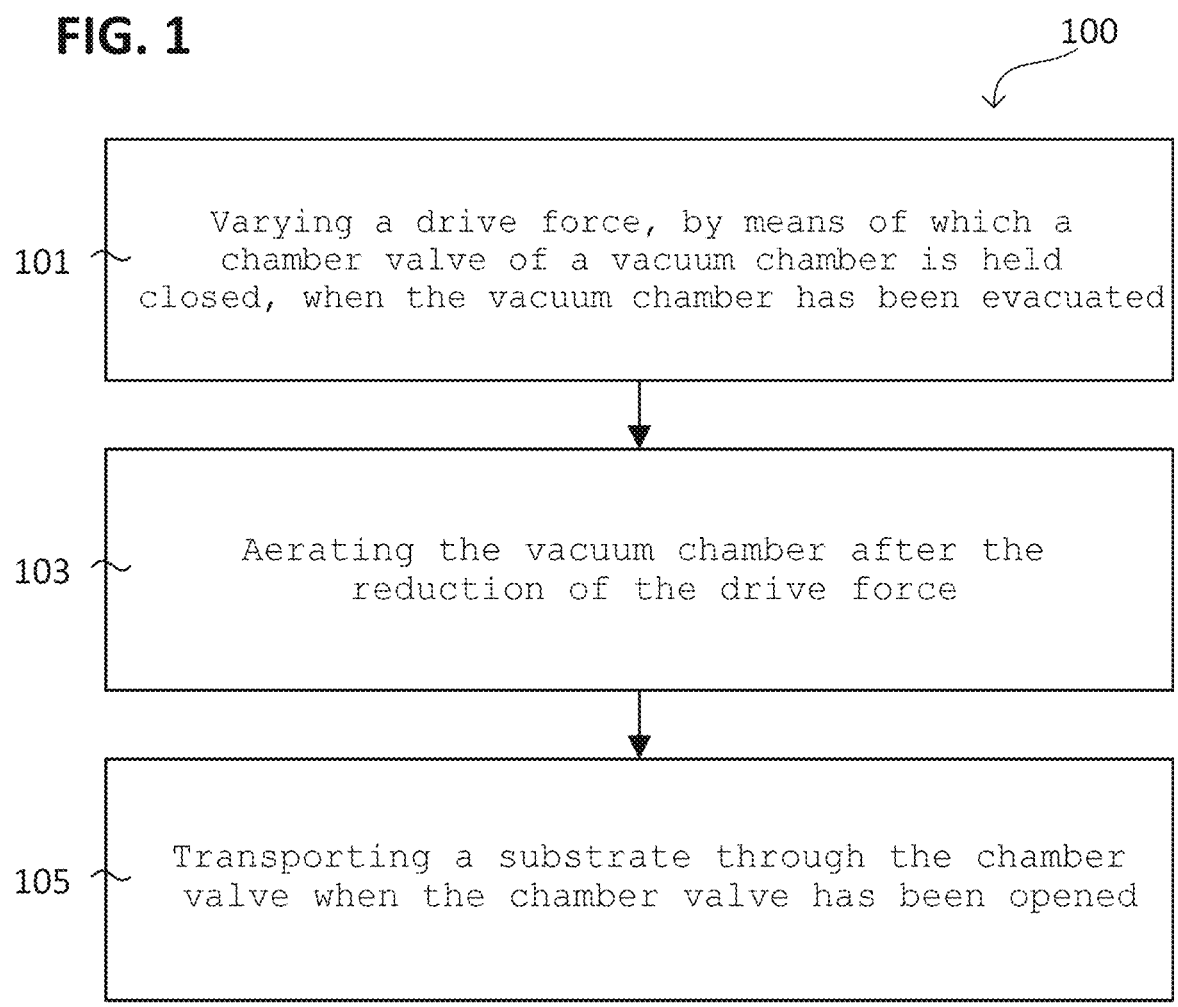

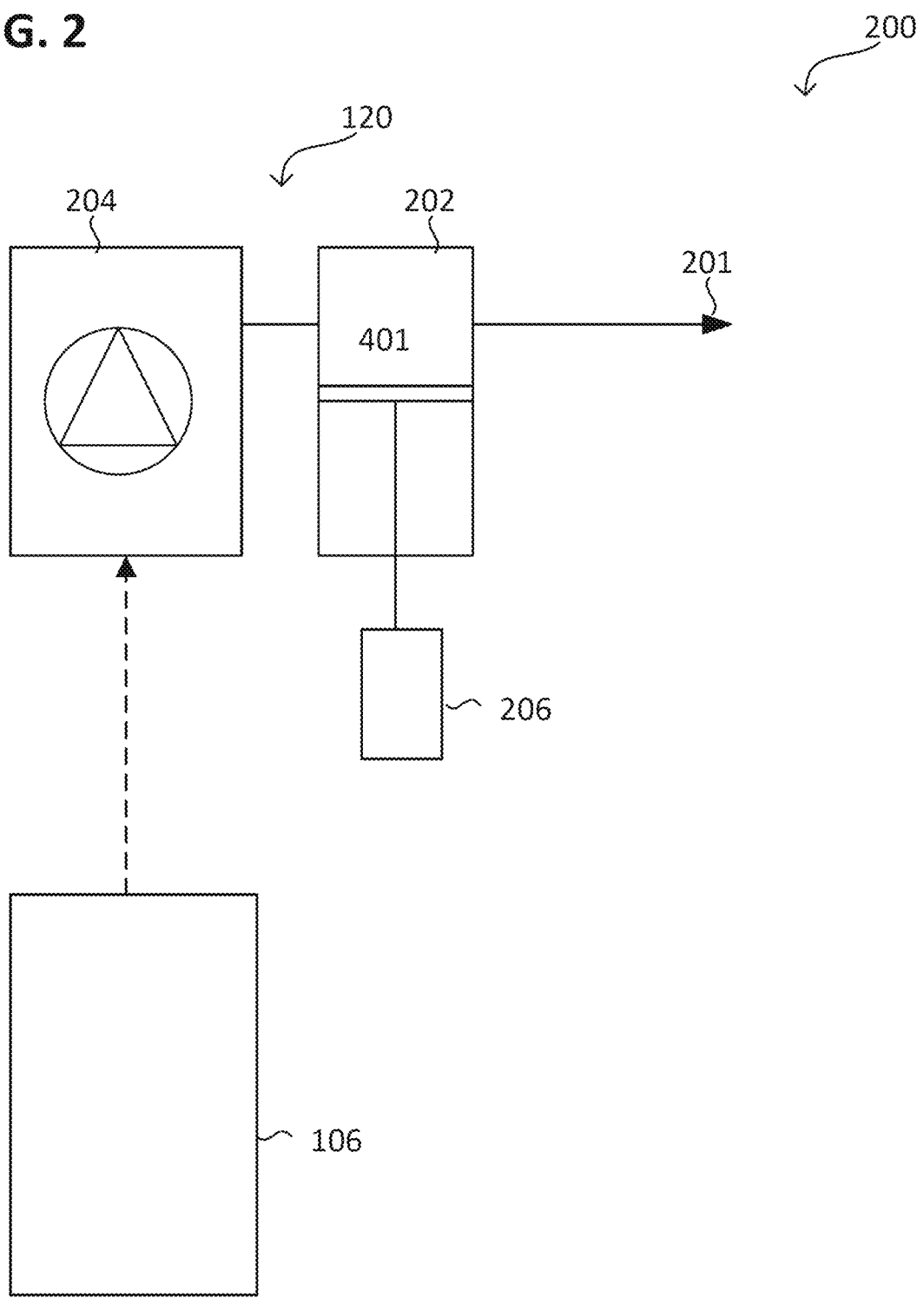

METHOD, CONTROL DEVICE AND VACUUM ARRANGEMENT

CROSS-CITING TO RELATED APPLICATIONS

This application claims priority to German Application 10 2019 134 546.4, which was filed on Dec. 16, 2019, the entirety of which is incorporated herein fully by reference.

TECHNICAL FIELD

Various exemplary aspects of the disclosure relate to a method, a control device and a vacuum arrangement.

BACKGROUND

In general, a processing installation may be utilized to process a substrate, such as for example a glass pane, a wafer or the like, in a vacuum. The processing of the substrate may be performed for example in a chamber of the processing installation, within which chamber the conditions required for the processing (process conditions) are provided. For this purpose, it may be expedient to seal off the chamber and/or further chambers of the processing installation with respect to one another or with respect to the surroundings of the processing installation.

Different chambers of a processing installation may be separated from one another by means of so-called chamber walls, for example by means of vertical chamber walls in the case of horizontal continuous coating installations (in-line installations). Here, each chamber wall may be extended through by a substrate transfer opening (also referred to as substrate transfer gap) such that a substrate may be transported through the substrate transfer opening, for example from a first chamber of a processing installation into a second chamber of a processing installation. Analogously, the processing installation may have a substrate transfer opening at an exit side/entrance side, such that a substrate may be moved into the processing installation and/or out of the processing installation.

To seal off different chambers of the processing installation with respect to one another or to seal off the processing installation to the outside, a substrate transfer opening of the respective chamber may be closed and/or sealed off by means of a valve flap. This makes it possible to transfer the substrate between different regions of different pressure. For example, cyclic aeration and/or evacuation of a so-called lock chamber may be performed for this purpose, which lock chamber is the exit-side/entrance-side chamber of the installation.

SUMMARY

According to various aspects of the disclosure, it has been identified that certain prerequisites for the aeration of a lock chamber have the effect that safety valves are triggered or other components (for example the chamber cover) are moved, which components are not designed for the escape of gas in large quantities owing to an overpressure. The safety valve is normally designed to prevent the formation of an overpressure in the lock chamber by virtue of the safety valve opening and in so doing discharging gas out of the lock chamber.

Such an overpressure may arise for example as a result of temperature differences, for example in the case of quenching of glass panes, in a lock chamber. In this context, it has been identified that the gas quantities that arise here may be so large that such a safety valve is subject to an increased risk of damage. Illustratively, the safety valve may for example be triggered upon every aeration process of the lock chamber, such that the triggering processes quickly bring said safety valve to the end of its service life. In other words, it has been identified that such a safety valve may be prematurely damaged.

Furthermore, it has been identified in this context that the gas that exits the lock chamber through the safety valve is no longer available for the subsequent process and must therefore be replaced. This furthermore increases the costs in the ongoing operation of the installation, even if the safety valve withstands the elevated load.

According to various aspects of the disclosure, a method, a control device and a vacuum arrangement are provided which reduce the operating costs, for example by virtue of these reducing the load on the safety valve, inhibiting an undesired movement of the chamber cover and reducing the quantity of gas that has to be replaced in the process. Illustratively, inter alia, a quick-acting flap valve is provided, which may be brought into a neutral position in which it may perform a free opening movement for the outflow of the gas atmosphere of the final vacuum chamber in the direction of a downstream cooling tunnel.

Illustratively, the method provided according to various aspects of the disclosure, the provided control device and the provided vacuum arrangement achieve that the safety valve (also referred to as poppet valve) is relieved of load, and thus costs are saved (for example by virtue of the service life thereof being lengthened). Furthermore, process interruptions are minimized, and/or fewer replacement parts are required, and thus further costs are reduced. Illustratively, it is for example possible to achieve uninterrupted operation of the vacuum arrangement, and for time to be saved in the overall cycle.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed aspect of the disclosure. In the following description, various aspects of the disclosure are described with reference to the following drawings, in which:

FIG. 1 shows a method according to various aspects of the disclosure in a schematic flow diagram; and FIG. 2, FIGS. 3A, 3B and FIG. 4 each show a vacuum arrangement according to various aspects of the disclosure in a schematic side view or cross-sectional view.

DETAILED DESCRIPTION

Figure 3A:
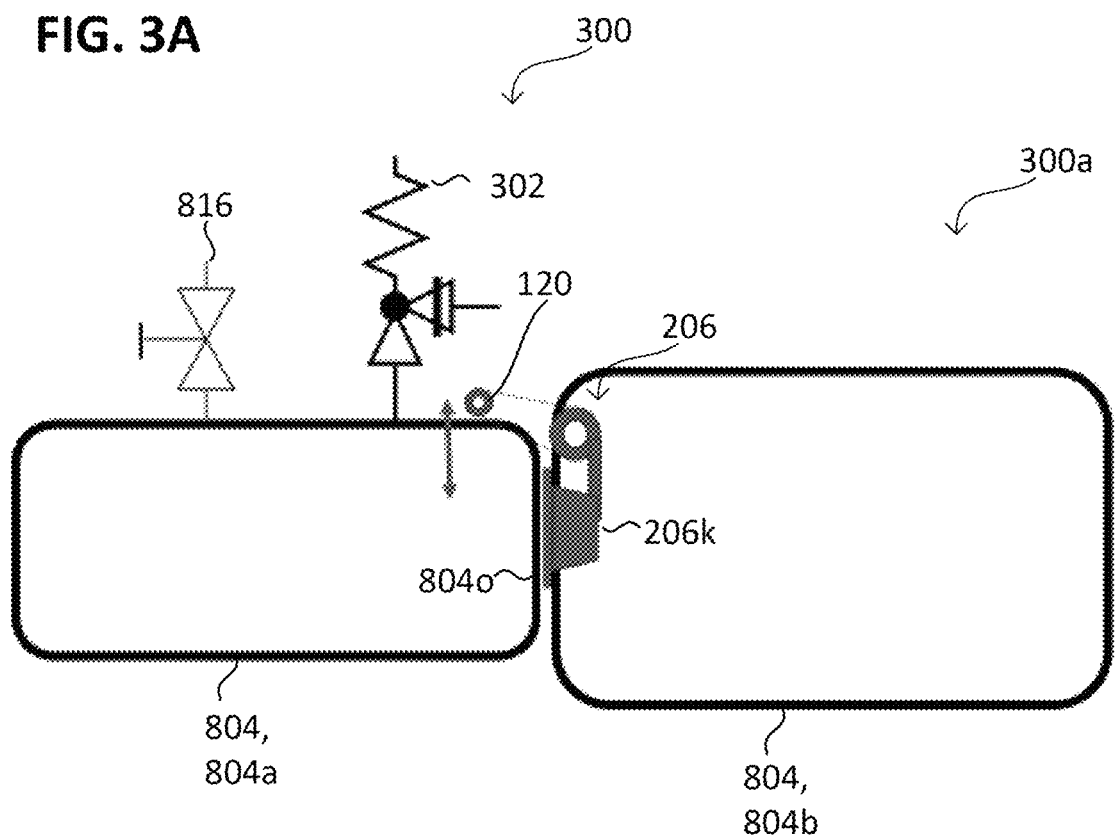

In the following detailed description, reference will be made to the appended drawings, which form part of this description and in which, for illustrative purposes, specific aspects of the disclosure are shown in which the disclosure may be implemented. In this regard, directional terminology such as "upwards", "downwards", "forwards", "rearwards", "front", "rear" etc. is used in relation to the orientation of the described figure(s). Since components of aspects of the disclosure may be positioned in a number of different orientations, the directional terminology serves for illustrative purposes and is in no way restrictive. It is self-evident that other aspects of the disclosure may be utilized, and structural or logical modifications made, without departing from the scope of protection of the present disclosure. It is self-evident that the features of the various exemplary aspects of the disclosure described herein may be combined with one another unless specifically stated otherwise. The following detailed description is therefore not to be considered in a restrictive sense, and the scope of protection of the present disclosure is defined by the appended claims.

In the context of this description, the expressions "connected", "attached" and "coupled" are used to describe both a direct and an indirect connection (for example fluidically conductive connection), a direct or indirect attachment and a direct or indirect coupling. In the figures, identical or similar elements have been denoted by identical reference designations where expedient.

According to various aspects of the disclosure, the expression "coupled" or "coupling" may be understood in the sense of a (for example mechanical, hydrostatic, thermal and/or electrical) for example direct or indirect connection and/or interaction.

Multiple elements may be coupled to one another, for example, along an interaction chain, along which the interaction (for example a fluid) may be transmitted. For example, two coupled-together elements may exchange an interaction with one another, for example a mechanical, hydrostatic, thermal and/or electrical interaction. According to various aspects of the disclosure, "engaged" may be understood in the sense of a mechanical (for example physical) coupling, for example by means of direct physical contact. An engagement may be configured to transmit a mechanical interaction (for example force, torque etc.).

A fluid-conducting coupling (for example connection) may be configured to transfer a fluid and/or exchange a fluid through the coupling. Optionally, the fluid-conducting coupling may be configured to, in a closed state, inhibit (for example block or shut off) the transfer of the fluid and, in an open state, permit the transfer of the fluid. The elimination and establishment of the fluid-conducting connection may be reversible, for example by means of the valve connected in between. For example, a valve may provide, and/or be switched between, the closed state and the open state.

In more general terms, a valve may make it possible for at least two components of a vacuum system (also referred to as vacuum components), between which the valve is connected, to be connected in fluid-conducting fashion to one another, such that these may exchange the fluid (for example including a gas) with one another. Likewise, the valve may make it possible to eliminate the fluid-conducting connection, such that the exchange of the fluid is blocked. The establishing of the connection and/or the elimination of the connection may be performed by virtue of the valve being actuated or being switched over by actuation (for example in selective fashion). The connection may be established in an open state of the valve and eliminated in a closed state of the valve. Switching over between the closed state and the open state may be performed (also referred to as adjustment process), for example in reversible, discrete or continuous fashion (for example assuming an intermediate state in between).

The expression "control device" may be understood to mean any type of logic-implementing entity, which may for example have a circuit and/or a processor which may execute software, which is stored in a memory medium, in firmware or in a combination of these, and output commands on the basis of this. The control device may for example be configured, by means of code segments (for example software), to control the operation of an entity (for example the operating point thereof), for example of a device or an operating function. The expression "processor" may be understood to mean any type of entity which permits the processing of data or signals. The data or signals may for example be handled in accordance with at least one (that is to say one or more than one) specific function which is executed by the processor.

Open-loop control may be understood to mean intentional influencing of an entity (for example of a device or of a process). Here, the present state of the entity (also referred to as actual state) may be varied in accordance with a specification (also referred to as setpoint state). Closed-loop control may be understood to mean open-loop control with additional counteraction of a change in state of the entity resulting from perturbations.

A processor may have or be formed from an analog circuit, a digital circuit, a mixed-signal circuit, a logic circuit, a microprocessor, a central processing unit (CPU), a graphics processing unit (GPU), a digital signal processor (DSP), a field-programmable gate array (FPGA), an integrated circuit or any combination of these. Any other form of implementation of the respective functions described in more detail below may also be understood as a processor or logic circuit. It is self-evident that one or more of the method steps described in detail herein may be executed (for example realized) by a processor by means of one or more specific functions executed by the processor. Similarly, the method steps may be represented by means of code segments which are configured to carry out the method steps when executed by the processor.

The actuation of the valve may be performed for example by means of an electrical control signal and/or by means of a fluid-mechanical control signal (for example a pressure change) which may be fed to a control input of the valve. The fluid-mechanical control signal may be applied by means of electrically controllable valves, that is to say valves which may be actuated by means of electrical signals. The electrically operated valves may for example be actuated by a control device which feeds a corresponding electrical control signal to the or each valve. By contrast to a purely pneumatic control mechanism, an electropneumatic control mechanism formed in this way makes significantly more complex functions possible, in particular through the use of electronic circuits such as for example a programmable logic control device, a shorter reaction time and/or a smaller structural form.

In various aspects of the disclosure, a chamber housing, for example a vacuum chamber provided therein, may be configured such that a pressure in a range from approximately 10 mbar to approximately 1 mbar (in other words coarse vacuum) may be provided therein, and/or a pressure in a range from approximately 1 mbar to approximately $10^{-3}$ mbar (in other words fine vacuum), and/or a pressure in a range from approximately $10^{-3}$ mbar to approximately $10^{-7}$ mbar (in other words high vacuum) and/or a pressure lower than high vacuum, for example lower than approximately $10^{-7}$ mbar.

In various aspects of the disclosure, a chamber housing may be configured for providing a vacuum or at least a negative pressure within the chamber housing. Illustratively, the chamber housing (for example the chamber walls thereof) may be configured to be so stable that it may be evacuated (pumped out) such that the chamber housing (or the chamber walls thereof) can, when it has been evacuated, be acted on from the outside by a pressure (for example the prevailing air pressure or a pressure several orders of magnitude higher than the pressure in the interior of the chamber housing) without the chamber housing being irreversibly deformed and/or damaged.

The chamber housing may be a constituent part (a main body) of a vacuum arrangement and have one or more than one vacuum chamber, for example one or more than one lock chamber, one or more than one buffer chamber, one or more than one transfer chamber, one or more than one process chamber (for example a coating chamber) and/or one or more than one gas separation chamber. Here, the respective functioning or the mode of operation of the vacuum chamber may be defined on the basis of the chamber cover used with the chamber housing, in conjunction with the fixtures (for example gas partitions, valves, filler bodies, transport device, etc.) arranged in the chamber housing. For example, the chamber housing may be used with a lock chamber cover as lock chamber and with a buffer chamber cover as buffer chamber or transfer chamber and with yet another chamber cover as coating chamber (or process chamber).

For the processing of a substrate or multiple substrates in a processing chamber of the processing installation, the processing chamber of the vacuum arrangement may have a processing source. A processing source may for example have a coating source (a magnetron, a tube magnetron or a double-tube magnetron, a planar magnetron or double-planar magnetron), an exposure device (a light source, a laser, a flash lamp or a flash lamp arrangement), a heat source (for example a heater), an etching device (for example an etching gas source or etching plasma source), a radiation source (for example an electron radiation source or ion radiation source), or the like.

According to various aspects of the disclosure, the substrate transfer opening of the vacuum chamber is utilized (by means of a flap valve) in order to discharge a pressure wave from the chamber. The gas thus released continues to encase the substrate and moves with the substrate in the transport direction, which reduces the gas consumption.

Illustratively, the (for example pneumatically, electrically and/or mechanically operated) valve flap is not held fixed but rather is released for the discharge of the pressure wave. When the substrate has arrived in the lock chamber and the upstream chamber valves have been closed (that is to say when vacuum is present in the chamber), the final chamber valve may be released, because it will continue to be held "closed" by the vacuum in the chamber and the surrounding atmosphere. The released valve flap may be freely movable, that is to say it may oscillate in or counter to its opening direction. If an aeration shock then occurs during the further process, the valve flap may be opened by the pressure wave.

Optionally, the valve flap may be mounted by means of a holding circuit such that said valve flap does not close again of its own accord (that is to say only owing to the weight force). The holding circuit may hold the valve flap in its position in the closing direction. For this purpose, the holding circuit may for example have a locking mechanism or a spring which accommodates the weight force of the valve flap. Since this process occurs in a very short time, this may assist and accelerate the opening of the valve flap in the next step. The gas that has escaped through the substrate transfer opening may pass out of the vacuum chamber together with the substrate.

According to various aspects of the disclosure, by means of a 5/3 directional valve, a neutral central position may be provided which releases the valve flap. Optionally, quick ventilation means may be used in order to realize a faster release of the opening direction. Optionally, self-regulating damping of the movement of the pneumatic drive cylinders may be used for the purposes of conserving the mechanism.

According to various aspects of the disclosure, an optimization of the above-stated functionalities may be realized through adaptation of the geometry of the valve flap (for example effective area and/or weight) in order to save even more gas and/or in order to attain an even faster opening/closing of the valve flap.

FIG. 1 illustrates a method 100 according to various aspects of the disclosure in a schematic flow diagram. The method includes, in 101, varying (for example reducing) a (for example mechanical) drive force (for example a torque), by means of which a chamber valve of a vacuum chamber is held closed, when the vacuum chamber has been evacuated; in 103, aerating the vacuum chamber after the reduction of the drive force; and in 105, transporting a substrate through the chamber valve or the substrate transfer opening thereof when the chamber valve has been opened.

The chamber valve may for example have a valve flap (then also referred to as flap valve), which will be referred to below. The description given may also apply analogously to a differently configured chamber valve.

By means of the drive force, a valve flap of the chamber valve may be pressed against a sealing surface which surrounds the substrate transfer opening.

For example, the drive force may be generated by means of a drive device. The variation 101 of the drive force may be performed by virtue of the drive device being switched over between multiple operating modes, as will be described in more detail further below.

The drive device may be engaged with the chamber valve. The drive device may for example have or be formed from a fluid-mechanical (for example pneumatic and/or hydraulic) actuator. Alternatively or in addition, the drive device may have or be formed from an electrical actuator (for example an electric drive).

The drive device may optionally have a lever or some other mechanism which is configured to transmit the drive force (for example as a torque) to the chamber valve.

The fluid-mechanical actuator may be configured to convert hydrostatic energy into the drive force, for example by means of a stroke-type piston. The electric actuator may be configured to convert electrical energy into the drive force. Below, for easier understanding, an actuator in the form of a stroke-type piston will be referred to. The description given, or the described functions of the drive device, may also apply analogously to a drive device of some other type. For example, as an alternative or in addition to the stroke-type piston, use may be made of a rotary drive for which a passive mode (illustratively, a force-free mode) is provided. For example, the passive mode of the rotary drive may be provided by virtue of said rotary drive being switched into an electrically deenergized state.

FIG. 2 illustrates a vacuum arrangement 200 according to various aspects of the disclosure in a schematic side view or cross-sectional view, which vacuum arrangement implements the method 100 by means of a control device 106.

The drive device 120 of the vacuum arrangement 200 may have the stroke-type piston 202 and a compressor 204 (also referred to as compression device). The compressor 204 may be configured to compress a fluid (for example including a gas or a liquid) in order to provide the hydrostatic energy. Below, for easier understanding, a gas as fluid will be referred to. The description given, or the described functions of the drive device, may also apply analogously to some other fluid, for example for a liquid.

The stroke-type piston 202 may have one or more than one pressure chamber 401 to which the compressed gas is assigned.

The drive device 120 may provide multiple operating modes, for example a first operating mode (also referred to as closed mode), a second operating mode (also referred to as passive mode) and a third operating mode (also referred to as open mode). In the closed mode, the drive device 120 may close the chamber valve 206, and/or hold this closed, by means of the provided drive force (for example a torque). In the open mode, the drive device 120 may open the chamber valve 206, and/or hold this open, by means of the provided drive force.

The closed mode and the open mode may thus differ in terms of the direction and/or the magnitude of the drive force that is transmitted to the chamber valve 206. In the passive mode, the drive force transmitted to the chamber valve 206 (for example the magnitude of said drive force) may be smaller than in the closed mode and/or in the open mode.

In the closed mode, the chamber valve 206 may be pressed by means of the drive force against a sealing surface of a vacuum chamber. In the open mode, the chamber valve 206 may be pulled away from the sealing surface of the vacuum chamber, for example counter to its weight force, by means of the drive force. In the passive mode, the drive force transmitted to the chamber valve 206 (for example the magnitude of said drive force) may be so small that the chamber valve 206 is freely movable (that is to say is released). This makes it possible for the chamber valve 206 to open already in the presence of a low overpressure (for example of lower than 0.1 bar) in the vacuum chamber.

Illustratively, the chamber valve 206 may, by means of the passive mode, provide an overpressure valve. Optionally, in the passive mode, the drive force may act counter to the weight force of the valve flap. This makes it possible for the chamber valve 206 to open already in the presence of an even lower overpressure (for example of lower than 0.05 bar).

The control device 106 may be configured to switch over the drive device 120 from the closed mode into the passive mode when the chamber valve 206 is exposed to a pressure difference which holds the chamber valve closed. The pressure difference may for example be the difference between the atmospheric pressure and the chamber pressure (also referred to as chamber interior pressure). This makes it possible to release the chamber valve 206 already before an overpressure has formed in the vacuum chamber.

The control device 106 may furthermore be configured to switch over the drive device 120 from the passive mode into the open mode when the pressure difference has been reduced. The reduction of the pressure difference may occur by virtue of the vacuum chamber being aerated. This makes it possible to open the chamber valve 206 after a pressure equalization has occurred in the vacuum chamber.

The passive mode may for example include that a pressure chamber 401 of the stroke-type piston 202 is ventilated 201. The ventilation may for example include connecting the pressure chamber 401 in fluid-conducting fashion to the atmosphere or at least expanding the gas in the stroke-type piston 202. This makes it possible for the pressure chamber 401 to exchange gas with the atmosphere. The ventilation may alternatively or additionally include connecting two pressure chambers 401 of the stroke-type piston 202 to one another in fluid-conducting fashion. This makes it possible for the two pressure chambers 401 to exchange gas with one another (such that less air passes into the stroke-type piston).

A pressure described herein, or the difference thereof (also referred to as pressure difference) in relation to a pressure used as reference pressure, may be detected by means of a corresponding sensor, for example by means of a pressure sensor. The detected pressure may for example be the chamber interior pressure.

A sensor (also referred to as detector) may be understood to mean a transducer which is configured to qualitatively or quantitatively detect a characteristic, corresponding to the sensor type, of the surroundings of said sensor, for example a physical or chemical characteristic and/or a material condition. The measured variable is the physical variable that the measurement by means of the sensor applies to. A sensor may be part of a measurement chain which has a corresponding infrastructure (for example having processor, memory medium and/or bus system or the like). The measurement chain may be configured to actuate the corresponding sensor (for example water sensor, pressure sensor and/or actuation sensor), process the detected measured variable thereof as input variable, and on the basis of this provide an electrical signal as output variable, which represents the state of the input variable at the time of the detection. The measurement chain may for example be implemented by means of the control device 106.

Figure 3B:
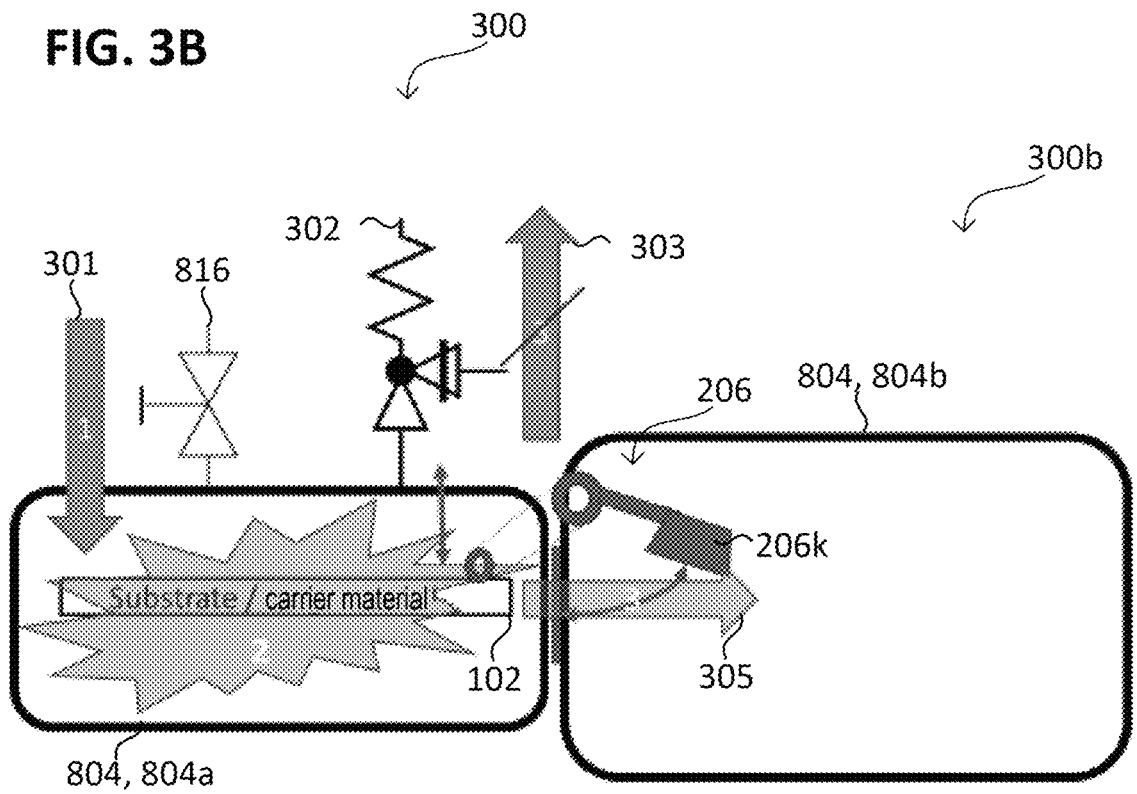

FIG. 3A and FIG. 3B each illustrate a vacuum arrangement 200 according to various aspects of the disclosure 300 in a schematic side view or cross-sectional view, wherein the vacuum arrangement 200 is illustrated in various phases of an operating sequence. The vacuum arrangement 200 according to various aspects 300 of the disclosure may have one or more than one vacuum chamber 804 which has a chamber wall which is extended through by a chamber opening 804o (also referred to as substrate transfer opening 804o). Multiple vacuum chambers 804 may be connected by means of corresponding chamber openings 804o to form a common vacuum system.

The chamber valve 206 may have the chamber opening 804o and a valve flap which covers or seals off the chamber opening 804o in the closed state. In the closed state of the chamber valve 206, the (for example pivotable) valve flap may be in a closed position and pressed by means of the drive force against a chamber wall, which delimits the chamber opening 804o, of the vacuum chamber 804.

Below, reference will be made to two chambers 804 which are connected to one another by means of the chamber valve 804o or the chamber opening 804o thereof (for example a vacuum chamber 804a and an atmosphere chamber 804b). The description given may also apply analogously if one of the two chambers 804 (for example the atmosphere chamber 804b) is omitted, or if both chambers are configured as vacuum chambers.

According to various aspects of the disclosure, a vacuum chamber may be provided by means of a chamber housing in which one chamber or multiple chambers may be provided. The chamber housing may for example, for the provision of a negative pressure or of a vacuum (vacuum chamber housing), be coupled (for example in gas-conducting fashion) to a pump arrangement 816, for example a vacuum pump arrangement, and be configured to be so stable that it withstands the action of the air pressure in the pumped-out state. The pump arrangement (having at least one vacuum pump, for example a high-vacuum pump, for example a turbomolecular pump) may make it possible for a proportion of the gas to be pumped out of the interior of the vacuum chamber. Accordingly, one vacuum chamber or multiple vacuum chambers may be provided in a chamber housing.

The chamber opening 804o may be covered by means of the valve flap 206k when the drive device is in the closed mode. Then, the chamber valve 206 may be closed (also referred to as closed state). In the closed state, a fluid-conducting connection between the two chambers 804 through the chamber opening 804*o* may be shut off.

The chamber opening 804*o* may be exposed by means of the valve flap 206*k* (that is to say have a spacing from the latter) when the drive device is in the open mode. Then, the chamber valve 206 may be open (also referred to as open state). In the open state, the fluid-conducting connection between the two vacuum chambers through the chamber opening 804*o* may be established.

In general, the chamber opening 804*o* may be configured to be of such a size that a substrate may be transported through it. For example, the chamber opening may have an extent (for example along the vertical) of more than approximately 0.5 m (meters), for example than approximately 1 m, for example than approximately 2 m, for example than approximately 3 m. This makes it possible for a substrate to be exchanged between the two chambers 804.

According to various aspects of the disclosure, the substrate may be in panel form and have or be formed from at least one of the following: a ceramic, a glass, a semiconductor (for example amorphous, polycrystalline or monocrystalline semiconductor, such as silicon), a metal, and/or a polymer (for example plastic). For example, the substrate may be a wafer (a semiconductor substrate), a metal film, a metal sheet or a glass panel, and may optionally be coated. The substrate may optionally be transported by means of a substrate carrier.

For the transport of the substrate, the vacuum arrangement 200 may have a transport device (not illustrated) with a multiplicity of transport rollers on which the substrate, or the substrate carrier into which the substrate has been placed, may be transported in supported fashion. The transport device may provide a transport path through the chamber valve 206 (for example the substrate transfer opening 804*o* thereof).

Optionally, the vacuum chamber 804*a* may have an overpressure valve 302. The overpressure valve 302 may be configured, that is to say to enable the flow of gas in a passage direction (out of the vacuum chamber 804*a*), as soon as a pressure difference prevailing across the overpressure valve 302 exceeds a predefined pressure difference (also referred to as enablement pressure or response pressure). In other words, the response pressure may be greater than zero. For this purpose, the overpressure valve 302 may for example have a spring element which defines the enablement pressure. The spring element may for example provide a force which counteracts the opening of the overpressure valve 302 in the passage direction, for example by virtue of the overpressure valve 302 being held closed by means of the spring element.

In a first phase 300*a*, the vacuum chamber 804*a* may have been pumped out (also referred to as evacuated) and/or have at least a lower pressure than the atmosphere chamber 804*b*. In the pumped-out state, the vacuum chamber may have a pressure lower than the atmospheric pressure. The atmospheric pressure (hereinafter considered for simplicity to be 1 bar) may be the pressure of the Earth's atmosphere at the location of the vacuum arrangement 200, which arises owing to the gravitational pressure of the Earth's atmosphere.

In the pumped-out state, the vacuum chamber (for example the interior thereof) may have a vacuum (that is to say a pressure of lower than 0.3 bar) or lower, for example a pressure in a range from approximately 1 mbar to approximately $10^{-3}$ mbar (in other words fine vacuum) or lower, for example a pressure in a range from approximately $10^{-3}$ mbar to approximately $10^{-7}$ mbar (in other words high vacuum) or lower, a pressure of lower than high vacuum, for example lower than approximately $10^{-7}$ mbar (in other words ultrahigh vacuum). Alternatively or in addition, the atmosphere chamber 804 (for example the interior thereof) may have atmospheric pressure.

In the first phase 300*a*, the chamber valve 206 may furthermore have been or be brought into the closed state. In other words, the drive device 120 may be in the closed mode.

For example, a pressure difference across the chamber valve 206 (that is to say in this case the pressure difference between the two chambers 804) may be greater than approximately 0.1 bar, for example than approximately 0.2 bar, for example than approximately 0.3 bar, for example than approximately 0.4 bar, for example than approximately 0.5 bar, for example than approximately 0.6 bar, for example than approximately 0.7 bar, for example than approximately 0.8 bar, for example than approximately 0.9 bar.

The pressure difference may press the valve flap 206*k* against that chamber wall (for example the sealing surface thereof) of the vacuum chamber 804*a* which is extended through by the chamber opening 804*o*. For example, the pressure difference may exert on the valve flap 206*k* a force which, together with the drive force, presses the valve flap 206*k* against the chamber wall.

In the second phase 300*b*, a substrate 102 may have been or may be brought into the vacuum chamber 804*a*. Subsequently, a gas may be supplied 301 to the vacuum chamber 804*a* in which the substrate is arranged (also referred to as aeration of the vacuum chamber). The aeration of the vacuum chamber 804*a* may include that the pressure in the vacuum chamber 804*a* (also referred to as chamber pressure) is increased, or the pressure difference across the chamber valve 206 is reduced. The pressure difference across the chamber valve 206 (that is to say the pressure difference prevailing at said chamber valve) may be the difference between the pressures acting on mutually opposite sides of the valve flap (or of the valve leaf thereof).

In the second phase 300*b*, the chamber valve 206 may be released by virtue of the drive force being reduced. In other words, the drive device may have been or be placed into the passive mode. This may be performed if the chamber pressure of the vacuum chamber 804*a* satisfies a predefined criterion (also referred to as release criterion). The release criterion may for example be satisfied if the chamber pressure overshoots a threshold value, for example 50% of the atmospheric pressure or 0.5 bar. Use may self-evidently also be made of some other threshold value, for example approximately 0.6 bar, approximately 0.7 bar, approximately 0.8 bar or approximately 0.9 bar. It is alternatively or additionally also possible, as release criterion, to use a pressure difference across the chamber valve 206 which corresponds to this. For example, the release criterion may be satisfied if the pressure difference across the chamber valve 206 is less than approximately 50% of the atmospheric pressure or 0.5 bar, for example than approximately 0.4 bar, than approximately 0.3 bar, than approximately 0.2 bar or than approximately 0.1 bar.

Optionally, the release criterion may be satisfied if the chamber pressure is lower than the response pressure of the overpressure valve 302, that is to say before the chamber pressure reaches the response pressure. This prevents the supplied 301 gas from parasitically escaping 303 through the overpressure valve 302 (illustrated here by means of a struck-through arrow). For example, the chamber valve 206 is opened as soon as the pressure difference (e.g., drop)

across the chamber valve is eliminated or reversed. This has the effect that the gas escapes predominantly (for example only) through the chamber opening 804o, for example before the response pressure of the overpressure valve 302 is overshot.

Illustratively, the chamber valve 206 switched into a force-free state in this way may implement an additional overpressure valve, the response pressure of which is lower than the response pressure of the overpressure valve 302. The drive force may (though need not necessarily) be reduced to zero in the passive mode. The remaining drive force may at any rate be so low, and/or directed, such that the response pressure of the chamber valve 206 (that is to say the pressure at which the chamber valve 206 opens) is lower than the response pressure of the overpressure valve 302.

Alternatively or in addition, in the second phase 300b, more gas may escape through the chamber valve 206 than through the overpressure valve 302.

Optionally, the substrate 102 may have been or be heated. For example, the substrate 102 may, before it is introduced into the vacuum chamber 804a and/or in the latter, have been or be warmed to a temperature (also referred to as substrate temperature) higher than room temperature. For example, the substrate temperature may be approximately 100° C. or higher, for example approximately 200° C. or higher, for example approximately 300° C. or higher, for example approximately 400° C. or higher.

The substrate 102 arranged in the vacuum chamber 804a may have the substrate temperature when or before the vacuum chamber 104a is aerated 301. A temperature of the gas which is supplied 301 here (also referred to as gas temperature) may be lower than the substrate temperature. For example, a difference between the substrate temperature and the gas temperature may be greater than approximately 100° C., for example than approximately 200° C., for example than approximately 300° C., for example than approximately 400° C.

This temperature difference between the substrate temperature and the gas temperature may have the result that the gas warms up when it comes into contact with the substrate, thus expands (also referred to as impingement shock or aeration shock), and cools the substrate. The expansion of the gas may accelerate the increase of the pressure in the vacuum chamber 804a, such that an overpressure could arise if the gas were unable to escape through the chamber opening 804o. By means of the gas thus supplied, the warmed substrate 102 may for example be abruptly cooled (also referred to as quenching).

After the second phase 300b, the substrate may be transported through the opened chamber valve 206 (that is to say the substrate transfer opening 804o thereof), for example into the atmosphere chamber 804b. Further cooling of the substrate 102 at atmospheric pressure may occur in the atmosphere chamber 804b. In other words, the atmosphere chamber 804b may be configured as a cooling chamber.

In one example, in the first phase 300a, the flap valve 206 may be held fixed in a closed position (for example by means of a pneumatic circuit 120). In the second phase 300b, the impingement shock may escape only through the chamber opening 804o.

In order that the escaping gas is supplied to the atmosphere chamber 804b and/or remains available for the process or moves in the transport direction, the drive device 120 may be switched into the passive mode. This has the effect that the safety valve 302 (also referred to as safety overpressure valve) is conserved or does not need to be triggered.

In one example, in the second phase 300b, the flap valve 206 may not be held fixed in the closed state. Then, the chamber door (for example the flap valve 206) is opened by means of the control device 106. The impingement shock may escape primarily via the flap valve 206 (illustratively, also referred to as chamber door). The gas thus remains available for the process and moves in the transport direction with the substrate 102. Furthermore, the safety valve 302 is conserved or is not triggered at all.

According to various aspects of the disclosure, the chamber valve 206 (for example flap valve) may be configured for sealing off a vacuum chamber housing. The chamber valve may have: a sealing surface, which is extended through by a substrate transfer opening, a valve flap, which has a first end portion, a second end portion and a sealing portion between these; a bearing arrangement for the pivotable mounting of the valve flap, wherein the bearing arrangement is for example engaged with the first end portion and the second end portion and optionally with the sealing portion, wherein the valve flap (for example the sealing portion thereof), in a closed state of the chamber valve, presses against the sealing surface and, in an open state of the chamber valve, has a spacing to said sealing surface.

Figure 4:
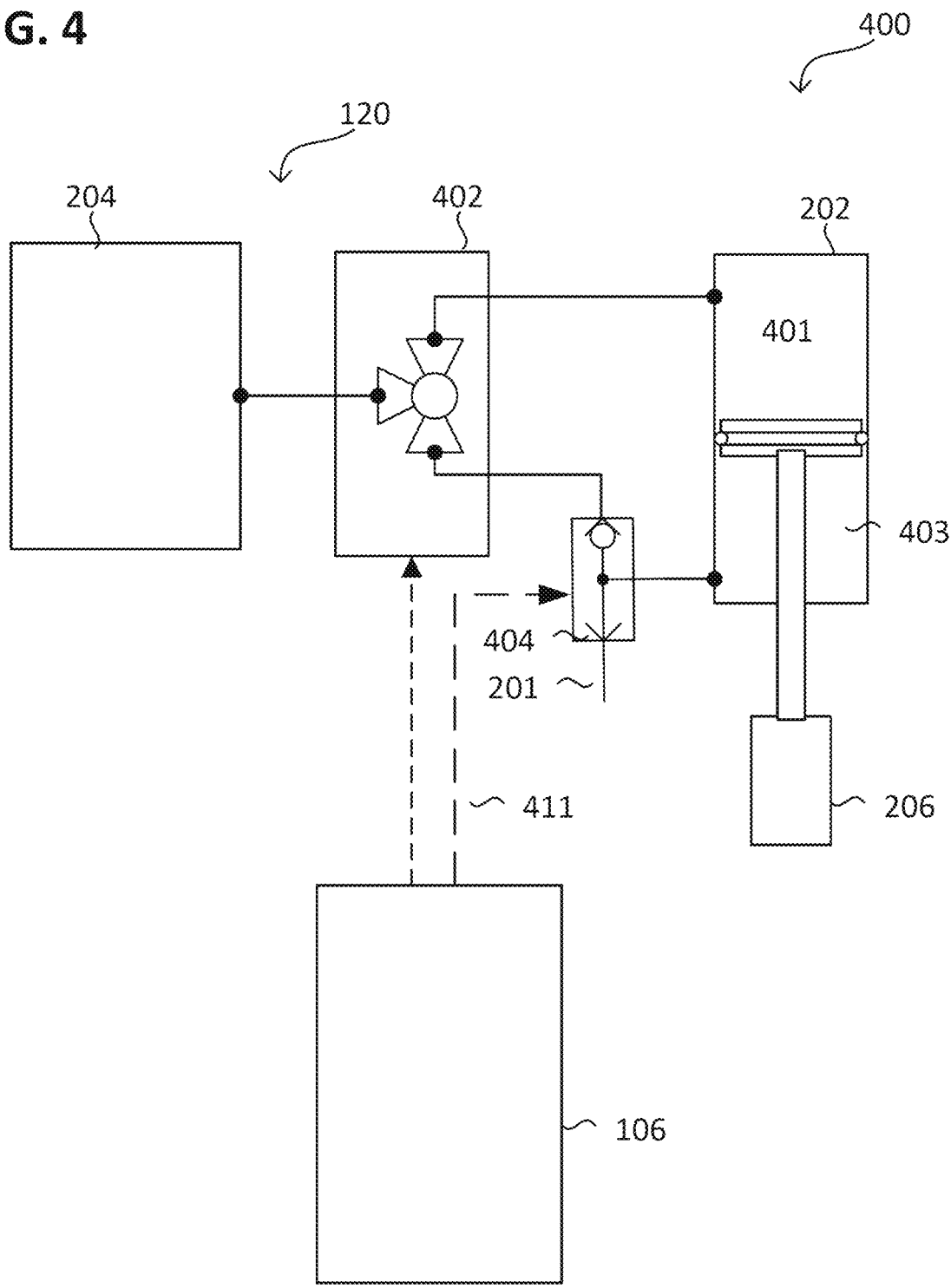

FIG. 4 illustrates a vacuum arrangement 200 according to various aspects 400 of the disclosure in a schematic side view or cross-sectional view, which vacuum arrangement implements the method 100 by means of a control device 106. One stroke-type piston 202 will be referred to below. The drive device may for example optionally have multiple stroke-type pistons 202 which may be actuated/interconnected as described with regard to the one stroke-type piston 202.

The vacuum arrangement 200 may have the compressor 204 (more generally also referred to as pressure generator), the stroke-type piston 202 and, connected between these, a three-way valve as control valve 402. The control valve 402 may be coupled at an output side to each of the two pressure chambers of the stroke-type piston 202. As an alternative to the three-way valve 402, it is for example possible, in a more complex implementation, to use a 5/3 directional valve as control valve 402.

In the open mode, a first pressure chamber 401 of the stroke-type piston 202 may be pressurized, that is to say connected in fluid-conducting fashion by means of the control valve 402 to the pressure generator 204. In the closed mode, a second pressure chamber 403 of the stroke-type piston 202 may be pressurized, that is to say connected in fluid-conducting fashion by means of the control valve 402 to the pressure generator 204. In the passive mode, the pressure in the second pressure chamber 403 may be dissipated, for example by virtue of said second pressure chamber being connected in fluid-conducting fashion to the first pressure chamber 401.

Between the second pressure chamber 403 and the control valve 402, there may be connected a quick ventilation means 404 which dissipates the pressure in the second pressure chamber 403 (that is to say ventilates the latter) in the passive mode. For this purpose, the quick ventilation means 404 may for example connect the second pressure chamber 403 in fluid-conducting fashion to the Earth's atmosphere in the passive mode.

In the passive mode, the pressure in the second pressure chamber 403 may have been or may be reduced, for example by virtue of said second pressure chamber being connected in fluid-conducting fashion by means of the control valve to the first pressure chamber 401 and/or by virtue of said second pressure chamber being connected in fluid-conducting fashion by means of the quick ventilation means 404 to the Earth's atmosphere.

For the switchover between the various modes, the control device may actuate 411 the control valve 402 and/or the quick ventilation means 404.

A 5/3 directional valve may additionally have a so-called neutral position into which it may have been or may be brought in the passive mode and by means of which the second pressure chamber 403 may be ventilated. It is self-evidently also possible for one or more than one valve of some other type to be used as control valve 402. Optionally, the control valve 402 and/or the quick ventilation means 404 may have or be formed from a fluid-mechanical valve.

A fluid-mechanical valve (for example a pneumatic valve) may have a fitting (for example including a flap, a slide or the like) and a fluid-mechanical actuator, which has the control inlet, for example a diaphragm, a piston or the like. The fluid-mechanical actuator may be configured to convert the fluid-mechanical change in pressure into a mechanical movement (or the change thereof) and transmit the mechanical movement to the fitting, such that a cross-sectional reduction or cross-sectional enlargement of the fluid-conducting connection occurs.

In one example, the flap valve 206, in the second phase 300*b*, is not held fixed but rather is released in the closed state. After the substrate 102 has been arranged in the closed chamber 104*a*, a pneumatic valve 402 (for example a 5/3 directional valve) is switched into a neutral mode and the "opening" movement direction is released by means of a quick ventilation means 404. The thus released chamber valve 206 (in the passive mode) may thus be freely opened.

The passive mode has been described above in terms of a mechanical implementation. The description given may also apply analogously for an electronically implemented passive mode. In other words, a circuit (for example pneumatic circuit) and/or software may be used to implement a mode (referred to here as passive mode for easier understanding) in which the aeration shock may escape primarily via the flap valve.

The passive mode may optionally be configured such that the valve flap 206*k*, which has been opened by the escaping gas, of the chamber valve 206 does not close of its own accord. In other words, a holding function may be implemented which is configured to maintain a position of the valve flap, for example counter to the weight force thereof.

Optionally, the drive device 120 and/or the control device 106 may be configured to implement end position damping, as will be described in more detail below. The end position damping allows a faster switching process of the chamber valve 206, for example in order to switch over between the open state and the closed state.

End position damping may be understood to mean a mechanism which brakes a movement before an end position is reached. The end position may be the position of the valve flap in the closed state (also referred to as closed position) or the position of the valve flap in the open state (also referred to as open position). The end position damping is provided for example to brake the stroke-type piston and thus prevent damage to the stroke-type piston and/or to its end positions of the pressure chambers as a result of a fast impact of the piston.

The end position damping may for example be implemented in mechanical form. For this purpose, it is for example possible for a mechanical damping element (for example including an elastomer) to be attached at the end position and/or to the moving parts of the actuator. The damping element may be configured to dissipate kinetic energy of the stroke-type piston (that is to say convert said kinetic energy into heat by means of friction). For example, the stroke-type piston plate may have damping pistons on both sides.

The end position damping may alternatively or additionally be implemented in electronic form, for example as self-regulating damping. For this purpose, the control device 106 may have an electronic damping element which is configured to actuate 411 the control valve 402 such that said control valve brakes the switching process when the end position is reached. By means of the electronic end position damping, the drive force provided by means of the drive device is varied in a manner dependent on the position of the valve flap 206*k*, for example when the open position and/or the closed position of the valve flap 206*k* is reached. Optionally, the damping factor of the electronic damping element may be adjustable. This makes it possible to adjust the end position damping to the prevailing conditions.

Various examples will be described below, which relate to the description given above and the illustration given in the figures.

Example 1 is a method, including: varying (e.g., changing, for example reducing) a drive force, by means of which a chamber valve of a vacuum chamber is held closed, when the vacuum chamber has been evacuated; and aerating (e.g., bringing gas into and/or increasing a gas pressure in) the vacuum chamber (that is to say supplying gas into the vacuum chamber) after the variation of the drive force; transporting a substrate through the chamber valve when the chamber valve has been opened.

Example 2 is the method according to example 1, wherein the drive force is generated by means of a drive device.

Example 3 is the method according to example 2, wherein the reduction of the drive force includes ventilating (e.g., de-airing and/or venting) a pressure chamber of the drive device by means of which the drive force is generated.

Example 4 is the method according to any of examples 1 to 3, wherein the reduction of the drive force (for example ventilation) is performed using a quick air vent (e.g., a quick ventilation means or quick venting device).

Example 5 is the method according to any of examples 1 to 4, wherein the chamber valve has: a valve flap, which has a first end portion, a second end portion and a sealing portion between these; and a bearing arrangement by means of which the valve flap is pivotably mounted, wherein the bearing arrangement is optionally furthermore configured for pivoting the valve flap between an open position (in an open state of the chamber valve) and a closed position (in a closed state of the chamber valve); and wherein, for example, the sealing portion is configured for sealing off a substrate transfer opening in the closed position of the valve flap, wherein, for example, the bearing arrangement has multiple pivotably mounted pivot arms, wherein the sealing portion has for example an encircling groove for receiving a seal in the groove (and/or wherein the sealing portion has the seal).

Example 6 is the method according to any of examples 1 to 5, wherein the drive device has one or more than one stroke-type piston, for example one stroke-type piston per pivot arm.

Example 7 is the method according to any of examples 1 to 6, wherein the variation of the drive force causes a reduction of the contact pressure force (e.g., on-pressure force) of the chamber valve, for example of the contact pressure force with which the valve flap is pressed against a sealing surface surrounding the substrate transfer opening.

Example 8 is the method according to any of examples 1 to 7, wherein the drive force is varied (for example reduced) such that, during the aeration of the vacuum chamber, the chamber valve is at least partially opened, for example before an overpressure valve of the vacuum chamber.

Example 9 is the method according to example 8, wherein a gas supplied for the aeration of the vacuum chamber at least partially escapes through the at least partially opened chamber valve, for example into a chamber (for example atmosphere chamber) adjoining the vacuum chamber.

Example 10 is the method according to any of examples 1 to 9, wherein, during the aeration of the vacuum chamber, the substrate is arranged in the vacuum chamber.

Example 11 is the method according to any of examples 1 to 10, wherein, during the aeration, the substrate is at a higher temperature than a gas supplied for the aeration of the vacuum chamber.

Example 12 is the method according to any of examples 1 to 11, wherein a vacuum has been formed in the evacuated vacuum chamber, wherein, for example, gas is supplied to the vacuum chamber before the variation of the drive force is performed.

Example 13 is the method according to any of examples 1 to 12, wherein an atmospheric pressure is formed in the aerated vacuum chamber.

Example 14 is the method according to any of examples 1 to 13, wherein the variation of the drive force includes expanding a stroke-type cylinder (for example the pressure chamber thereof) of the drive device.

Example 15 is the method according to any of examples 1 to 14, wherein the drive force is reduced to a value at which the chamber valve has a lower response pressure than an overpressure valve of the vacuum chamber.

Example 16 is the method according to any of examples 1 to 15, furthermore including: transporting the substrate into the vacuum chamber when the chamber valve is held closed by means of the drive force and/or by means of a pressure difference acting on the chamber valve.

Example 17 is the method according to example 16, furthermore including: processing the substrate before it is transported into the vacuum chamber.

Example 18 is the method according to example 17, furthermore including: wherein the processing includes warming (e.g., heating) the substrate (for example to a substrate temperature) and/or coating the substrate (for example when the substrate has been warmed).

Example 19 is the method according to any of examples 1 to 18, wherein the reduction of the drive force includes varying the drive force from a first value to a second value, wherein the second value is substantially zero or is at least less than 50% (for example than 25%, for example than 10%, for example than 5%) of the first value.

Example 20 is the method according to any of examples 1 to 19, wherein the reduction of the drive force (also referred to as switching into a force-free state) is performed when a pressure difference acting on the chamber valve is less than 50% (for example than 25%, for example than 10%, for example than 5%) of an atmospheric pressure.

Example 21 is a method for controlling (e.g., actuating) a drive device for a chamber valve in accordance with multiple operating modes (for example the chamber valve of the method according to any of examples 1 to 20), of which a first operating mode closes the chamber valve and/or holds this closed; a second operating mode releases the chamber valve; and a third operating mode opens the chamber valve and/or holds this open; wherein the method includes: switching over from the first operating mode to the second operating mode when the chamber valve is exposed to a pressure difference (for example detected by means of a sensor; for example less than 0.3 bar and/or more than 0.01 bar) which holds the chamber valve closed; and switching over from the second operating mode to the third operating mode after the pressure difference (for example detected by means of the sensor) has been reduced, for example by at least 50% (for example 75%) and/or before the pressure difference is eliminated or the direction thereof is reversed, wherein, for example, a pressure is detected which represents the pressure difference (for example with respect to the atmospheric pressure).

Example 22 is a control device or a nonvolatile memory medium, wherein the control device is for example configured to carry out the method according to example 21, wherein the memory medium has, for example, code segments which are configured to carry out the method according to example 21 when executed by a processor.

Example 23 is a vacuum arrangement, having: a control device according to example 22; and the drive device, which is coupled to the control device.

Example 24 is the vacuum arrangement according to example 23, wherein the drive device has a quick ventilation means, wherein the switchover between the multiple operating modes includes actuating the quick ventilation means.

Example 25 is the vacuum arrangement according to example 23 or 24, furthermore having: the chamber valve which (for example the valve flap of which) is engaged with the drive device.

Example 26 is the vacuum arrangement according to any of examples 23 to 25, wherein the drive device and/or the control device are configured such that end position damping is implemented, wherein the end position damping decelerates (e.g., brakes) a movement of the drive device when an open state or closed state of the chamber valve (for example open position or closed position of the valve flap) is reached.

Example 27 is the vacuum arrangement according to example 26, wherein the end position damping is implemented by means of a mechanical damping element (for example of the drive device) and/or by means of an electrical damping element (for example of the control device).

Example 28 is the vacuum arrangement according to example 27, wherein the electrical damping element is configured to be adjustable (for example, the damping factor thereof may be varied).

What is claimed is:

1. A method, comprising:
varying a drive force, by which a chamber valve of a vacuum chamber is held closed, when the vacuum chamber is evacuated, wherein the drive force is varied to a value at which the chamber valve has a lower response pressure than an overpressure valve of the vacuum chamber;
aerating the vacuum chamber after the variation of the drive force; and
transporting a substrate through the chamber valve when the chamber valve is opened.

2. The method as claimed in claim 1, wherein the drive force is generated by a drive device.

3. The method as claimed in claim 2, wherein the variation of the drive force comprises venting a pressure chamber of the drive device by which the drive force is generated.

4. The method as claimed in claim 1, wherein the variation of the drive force is performed using a quick air vent.

5. The method as claimed in claim 1, wherein the variation of a drive force causes a reduction of a contact pressure force of the chamber valve.

6. The method as claimed in claim 1, wherein the drive force is varied such that the chamber valve is at least partially opened during the aerating of the vacuum chamber, wherein a gas supplied for the aerating of the vacuum chamber at least partially escapes through the at least partially opened chamber valve.

7. The method as claimed in claim 1, wherein, during the aeration of the vacuum chamber, the substrate is arranged in the vacuum chamber, wherein, during the aeration, the substrate is at a higher temperature than a gas supplied for the aeration of the vacuum chamber.

8. The method as claimed in claim 1, further comprising: transporting the substrate into the vacuum chamber when the chamber valve is held closed by the drive force.

9. The method as claimed in claim 8, further comprising: heating the substrate before it is transported into the vacuum chamber.

10. The method as claimed in claim 1, wherein the variation of the drive force comprises varying the drive force from a first value to a second value, wherein the second value is substantially zero or is at least less than 50% of the first value.

11. The method as claimed in claim 1, wherein the variation of the drive force is performed when a pressure difference across the chamber valve is less than 50% of an atmospheric pressure.

12. A method for controlling a drive device for a chamber valve of a vacuum chamber in accordance with multiple operating modes, of which
   a first operating mode closes the chamber valve and/or holds the chamber valve closed;
   a second operating mode releases the chamber valve so that the chamber valve has a lower response pressure than an overpressure valve of the vacuum chamber;
   a third operating mode opens the chamber valve and/or holds the chamber valve opened;

wherein the method comprises:
   switching from the first operating mode to the second operating mode when the chamber valve is exposed to a pressure difference which holds the chamber valve closed; and
   switching from the second operating mode to the third operating mode after the pressure difference has been reduced.

13. A control device which is configured to carry out the method as claimed in claim 12.

14. A vacuum arrangement, having:
   a control device as claimed in claim 13; and
   the drive device coupled to the control device.

15. The vacuum arrangement as claimed in claim 14, wherein the drive device and/or the control device are configured such that an end position damping is implemented, wherein the end position damping decelerates a movement of the drive device when an open state or closed state of the chamber valve is reached.

16. The vacuum arrangement as claimed in claim 15, wherein the end position damping is implemented by a mechanical damping element and/or by an electrical damping element.

17. The vacuum arrangement as claimed in claim 16, wherein the electrical damping element is configured to be adjustable.

18. A method comprising:
   varying a drive force, by which a chamber valve of a vacuum chamber is held closed, when the vacuum chamber is evacuated;
   aerating the vacuum chamber after the variation of the drive force; and
   transporting a substrate through the chamber valve when the chamber valve is opened, wherein, during the aeration of the vacuum chamber, the substrate is arranged in the vacuum chamber, wherein, during the aeration, the substrate is at a higher temperature than a gas supplied for the aeration of the vacuum chamber.

* * * * *